US012813016B2

(12) United States Patent
Li et al.

(10) Patent No.: US 12,813,016 B2
(45) Date of Patent: Nov. 24, 2026

(54) LIGHT-EMITTING DEVICE AND LIGHT-EMITTING APPARATUS

(71) Applicant: TIANJIN SANAN OPTOELECTRONICS CO., LTD., Tianjin (CN)

(72) Inventors: Weihuan Li, Tianjin (CN); Jinghua Chen, Hongtang Town (CN); Yu-Ren Peng, Tianjin (CN); Huan-Shao Kuo, Tianjin (CN); Chia-Hung Chang, Xiamen (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 444 days.

(21) Appl. No.: 18/491,036

(22) Filed: Oct. 20, 2023

(65) Prior Publication Data

US 2024/0136471 A1 Apr. 25, 2024
US 2024/0234633 A9 Jul. 11, 2024

(30) Foreign Application Priority Data

Oct. 21, 2022 (CN) ......................... 202211295239.7

(51) Int. Cl.

| | |
|---|---|
| ***H10H 20/824*** | (2025.01) |
| ***H10H 20/811*** | (2025.01) |
| ***H10H 20/812*** | (2025.01) |
| ***H10H 20/852*** | (2025.01) |

(52) U.S. Cl.

CPC ........ *H10H 20/824* (2025.01); *H10H 20/811* (2025.01); *H10H 20/852* (2025.01); *H10H 20/812* (2025.01)

(58) Field of Classification Search

CPC .. H10H 20/824; H10H 20/811; H10H 20/852; H10H 20/812; H10H 20/825; H10H 20/82; H10H 20/8215; H10H 20/816; H10H 20/8162; H10H 20/817

See application file for complete search history.

(56) References Cited

U.S. PATENT DOCUMENTS 6,720,571 B1 * 4/2004 Tu ............................ H01S 5/34 257/15
2007/0223546 A1 * 9/2007 Brenner .............. H01S 5/34326 372/43.01
2018/0212097 A1 * 7/2018 Bour .................... H10H 20/811
2022/0085097 A1 * 3/2022 Song .................. H10H 20/0133

* cited by examiner

*Primary Examiner* — Benjamin Tzu-Hung Liu
(74) *Attorney, Agent, or Firm* — MUNCY, GEISSLER, OLDS & LOWE, P.C.

(57) ABSTRACT

A light-emitting device includes an epitaxial structure having a first surface and a second surface that is opposite to the first surface. The epitaxial structure includes, along a first direction from the first surface to the surface, a first-type semiconductor layer, an active layer, and a second-type semiconductor layer including a capping layer. The capping layer includes at least N1 number of sub-layers arranged in the first direction, where N1≥2. Each of the sub-layers of the capping layer contains a material represented by $Al_{y1}Ga_{1-y1}InP$, where $0<y1\leq1$. The capping layer has an Al content which increases and then remains constant along the first direction. A light-emitting apparatus includes the light-emitting device is also provided.

18 Claims, 5 Drawing Sheets

LIGHT-EMITTING DEVICE AND LIGHT-EMITTING APPARATUS

CROSS-REFERENCE TO RELATED APPLICATION

This application claims priority to Chinese Invention Patent Application No. CN 202211295239.7, filed on Oct. 21, 2022, which is incorporated herein by reference in its entirety.

FIELD

The disclosure relates to a light-emitting device and a light-emitting apparatus.

BACKGROUND

A light-emitting diode (LED) is a semiconductor light-emitting device that is typically made of a semiconductor material such as GaN, GaAs, GaP, GaAsP, AlGaInP, etc., and has a PN junction for light emitting. LEDs exhibit advantages such as high light-emitting intensity, energy efficiency, small size, long lifespan, etc., and have been widely used in various applications.

In recent years, LEDs have been widely used in daily life, such as illumination, signal displays, backlight sources, vehicle lamps, and large scale displays, and the like. These applications require a heightened level of brightness and luminous efficiency of LEDs. In a conventional LED, spacer layers and semiconductor layers disposed adjacent to an active layer on either side thereof each is formed of a single-layer material having identical composite, band gap, and thickness. In such a configuration, insufficient current spreading occurs due to overflow of charge carriers. This issue has created a bottleneck in improving brightness and luminous efficiency of the LEDs, and is to be addressed in the present disclosure.

SUMMARY

Therefore, an object of the disclosure is to provide a light-emitting device and a light-emitting apparatus that can alleviate at least one of the drawbacks of the prior art.

According to one aspect of the disclosure, the light-emitting device includes an epitaxial structure having a first surface and a second surface that is opposite to the first surface. The epitaxial structure includes, along a first direction from the first surface to the second surface, a first-type semiconductor layer, an active layer, and a second-type semiconductor layer including a capping layer. The capping layer includes at least N1 number of sub-layers arranged in the first direction, where N1≥2. Each of the sub-layers of the capping layer contains a material represented by $Al_{y1}Ga_{1-y1}InP$, where $0<y1\leq 1$. In addition, the capping layer has an Al content which increases and then remains constant along the first direction.

According to another aspect of the disclosure, the light-emitting apparatus includes the aforementioned light-emitting device.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
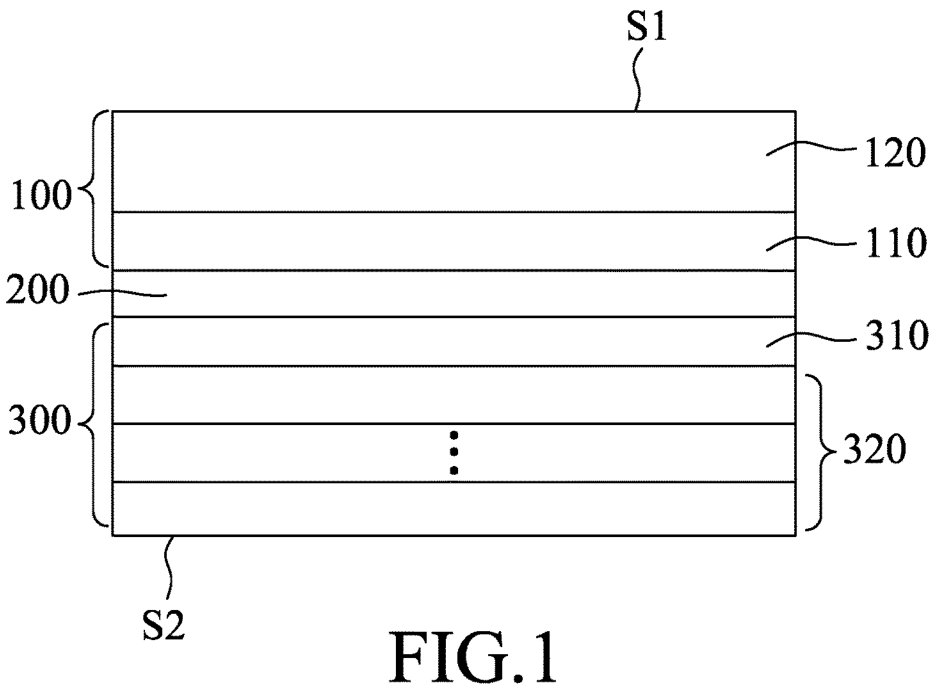
FIG. 1 shows a structural schematic view of a first embodiment of an epitaxial structure according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as “top,” “bottom,” “upper,” “lower,” “on,” “above,” “over,” “downwardly,” “upwardly” and the like may be used throughout the disclosure while making reference to the features as illustrated in the drawings. The features may be oriented differently (e.g., rotated 90 degrees or at other orientations) and the spatially relative terms used herein may be interpreted accordingly.

FIG. 1 shows a structural schematic view of a first embodiment of an epitaxial structure according to the present disclosure, which may be used in a light-emitting device (LED). The epitaxial structure is formed on a growth substrate (not shown) by physical vapor deposition (PVD), chemical vapor deposition (CVD), epitaxy growth technology, atomic layer deposition (ALD) or the like. The epitaxial structure has a first surface (S1) and a second surface (S2) that is opposite to the first surface (S1). The epitaxial structure includes a first-type semiconductor layer 100, an active layer 200, and a second-type semiconductor layer 300 arranged in such order along a first direction from the first surface (S1) to the surface (S2).

The first-type semiconductor layer 100 and the second-type semiconductor layer 300 have different conductivity types, electric properties, or polarity, and are doped with different dopants so as to provide electrons or holes. For example, when the first-type semiconductor layer 100 is an n-type semiconductor layer, the second-type semiconductor layer 300 is a p-type semiconductor layer, and vice versa. In forward bias, electrons recombine with holes in the active layer 200 sandwiched between the first-type semiconductor layer 100 and the second-type semiconductor layer 300, electrical energy being converted into light energy to emit light. Furthermore, by changing composition of the active layer 200, a wavelength of light emitted by the LED may be adjusted.

The active layer 200 is a region where the electrons and the holes recombine to emit light. Materials for the active layer 200 may determine the wavelength of the emitted light. For example, the active layer 200 that includes an aluminum gallium indium phosphide (AlGaInP)-based material may emit red light. The active layer 200 may be a single heterostructure (SH), a double heterostructure (DH), a double-sided double heterostructure (DDM), or a multiple quantum well (MQW) structure. Furthermore, the active layer 200 may include quantum well sub-layers and quantum barrier sub-layers, where the quantum barrier sub-layers have a larger band gap than the quantum well sub-layers. Varying the compositional ratio of semiconductor materials in the active layer 200 may result in LEDs that emit light with different wavelengths. In certain embodiments, the active layer 200 emits light having a wavelength ranging from 550 nm to 950 nm, such as red, yellow, orange, and infrared light. The active layer 200 may include a material capable of providing electroluminescence, such as AlGaInP or aluminum gallium arsenide (AlGaAs). More specifically, the active layer 200 may be an AlGaInP single quantum well (SQW) layer or MQW layer. In the present embodiment, the epitaxial structure emits red light.

In this embodiment, the second-type semiconductor layer 300 includes a second spacer layer 310 and a second capping layer 320 arranged in such order along the first direction, i.e., the second spacer layer 310 being positioned closer to the active layer 200 than the second capping layer 320. The second capping layer 320 includes multiple sub-layers (at least N1 number of sub-layers, where N1≥2). Each of the sub-layers of the second capping layer 320 contains a material represented by $Al_{y1}Ga_{1-y1}InP$, where $0<y1\leq1$. The second capping layer 320 has an Al content which increases and then remains constant along the first direction. This design can effectively block charge carriers from overflowing. In one embodiment, a last sub-layer of the sub-layers of the second capping layer 320 in the first direction (i.e., the sub-layer that is closest to the second surface S2) contains AlInP (y1=1). This design not only effectively reduces light absorption by the capping layer, but also allows charge carriers to spread laterally and flow uniformly into the active layer 200, thereby effectively improving brightness and luminous efficiency of the LED.

Figure 2:
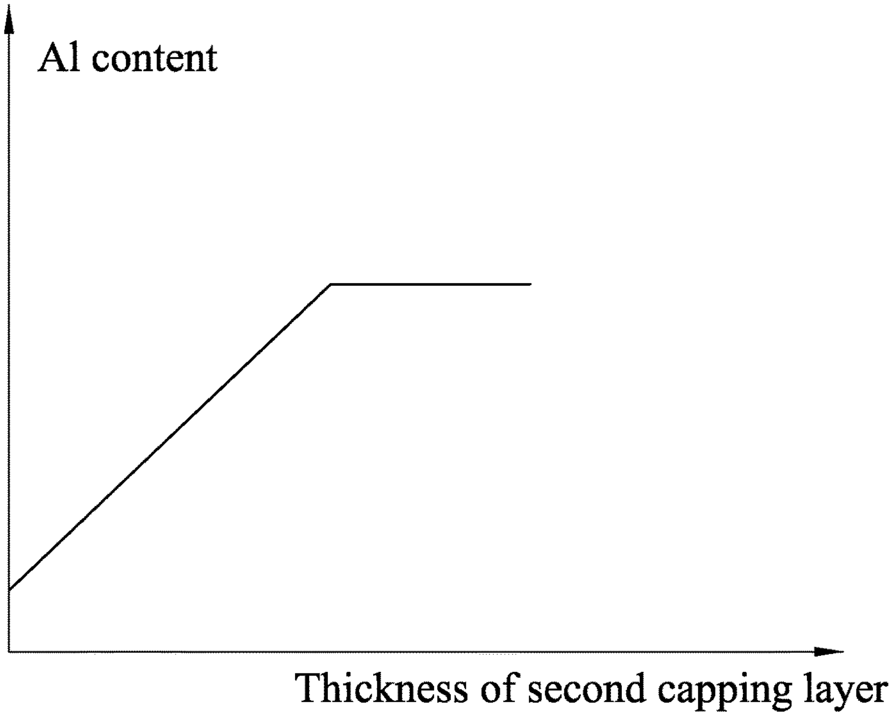
FIG. 2 illustrates an increase manner of an Al content within a capping layer of a second semiconductor layer of the epitaxial structure shown in FIG. 1.
Figure 3:
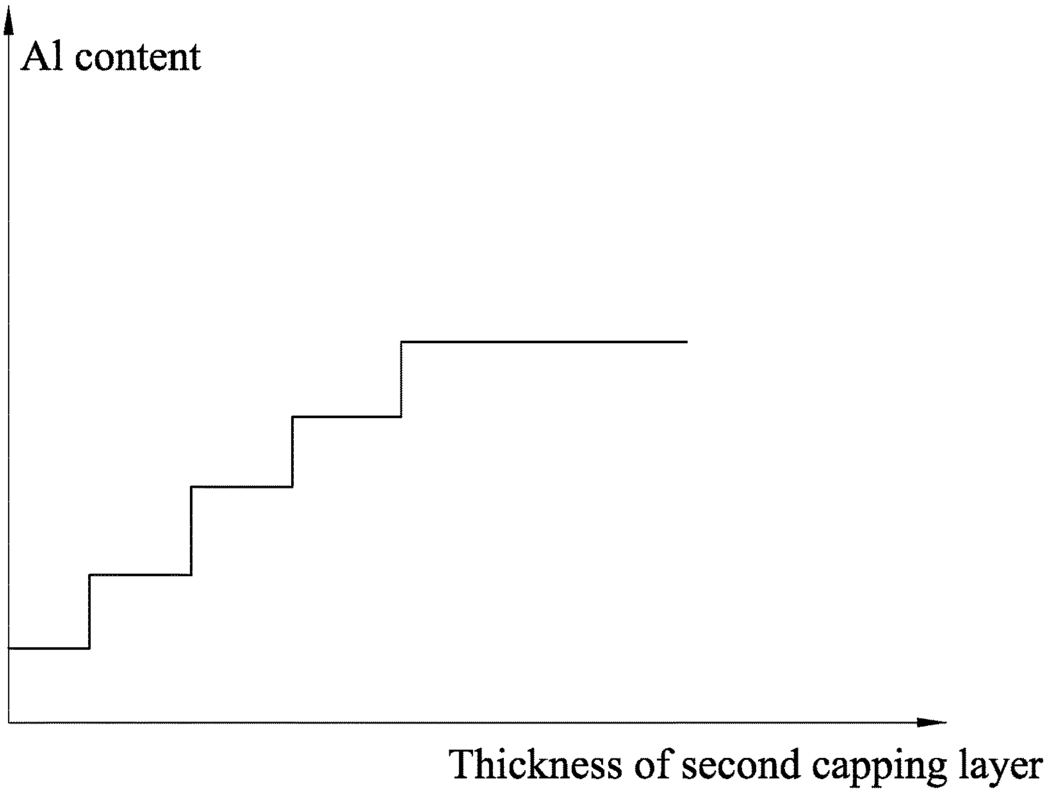
FIG. 3 illustrates another increase manner of an Al content within the capping layer of the second semiconductor layer of the epitaxial structure shown in FIG. 1.

As shown in FIG. 1, the first-type semiconductor layer 100 may include a first spacer layer 110 and a first capping layer 120 arranged in such order along a second direction from said second surface (S2) to said first surface (S1), i.e., the first spacer layer 110 being positioned closer to the active layer 200 than the first capping layer 120. In this embodiment, the Al content of the second capping layer 320 may increase either gradually or stepwise along the first direction. FIG. 2 illustrates a linear manner of the increase of the Al content within the second capping layer 320 along the first direction. FIG. 3 illustrates a stepwise manner of the increase of the Al content within the second capping layer 320 along the first direction. In either increase manner of Al content above, the capping layer 320 is effective at blocking charge carriers from overflowing.

Furthermore, in the present embodiment, the first and second spacer layers (310, 110) have the same doping type as those of the first and second capping layers (320, 120), respectively. For example, if the second capping layer 320 is doped with p-type dopant, the second spacer layer 310 may be doped with p-type dopant (p-type doped); if the first capping layer 120 is doped with n-type dopant, the first spacer layer 110 may be doped with n-type dopant (n-type doped). In some embodiments, portions of the first spacer layer 110 and the second spacer layer 310 may be unintentional doped, and the unintentional-doped portions may each have a doping concentration that is lower than $1E17/cm^3$. Each of the first spacer layer 110 and the second spacer layer 310 has a thickness less than 300 nm. The spacer layers 110, 310 may further block charge carriers from overflowing, improve spread uniformity of charge carriers, and reduce carrier overflow, thereby effectively enhancing the brightness and luminous efficiency of the LED.

In this embodiment, the p-type dopant for the second capping layer 320 may be, but not limited to, magnesium (Mg) or other equivalent dopants. In certain embodiments, the second capping layer 320 has a doping concentration ranging from $2E17/cm^3$ to $5E18/cm^3$. Moreover, the n-type dopant for the first capping layer 120 may be, but not limited to, silicon (Si) or tellurium (Te). In certain embodiments, the first capping layer 120 has a doping concentration ranging from $2E17/cm^3$ to $5E18/cm^3$. In some embodiments, the second capping layer 320 may be doped with an n-type dopant with a doping concentration ranging from $2E17/cm^3$ to $5E18/cm^3$.

In certain embodiments, the second spacer layer 310 contains a material represented by $Al_{x1}Ga_{1-x1}InP$, where $0.2\leq x1\leq1$; the second capping layer 320 contains a material represented by $Al_{y1}Ga_{1-y1}InP$, where $0.2\leq x1\leq y1\leq1$. In this embodiment, the second-type semiconductor layer 300 has an Al content that increases gradually along the first direction. With this design, charge carriers, when traveling from the second-type semiconductor layer 300 to the active layer 200, may spread laterally and distribute uniformly before flowing into the active layer 200.

Figure 4:
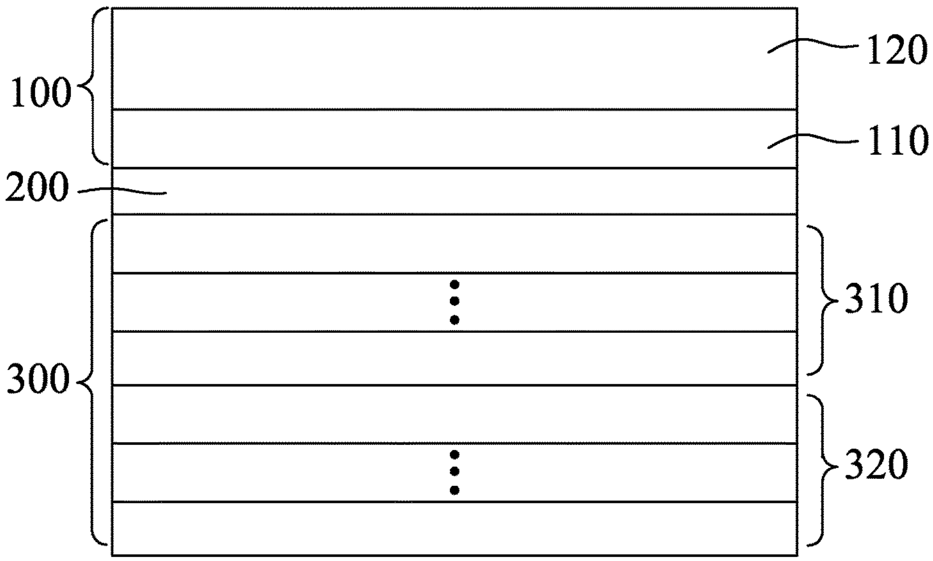
FIG. 4 shows a structural schematic view of a variation of the first embodiment of the epitaxial structure shown in FIG. 1.
Figure 5:
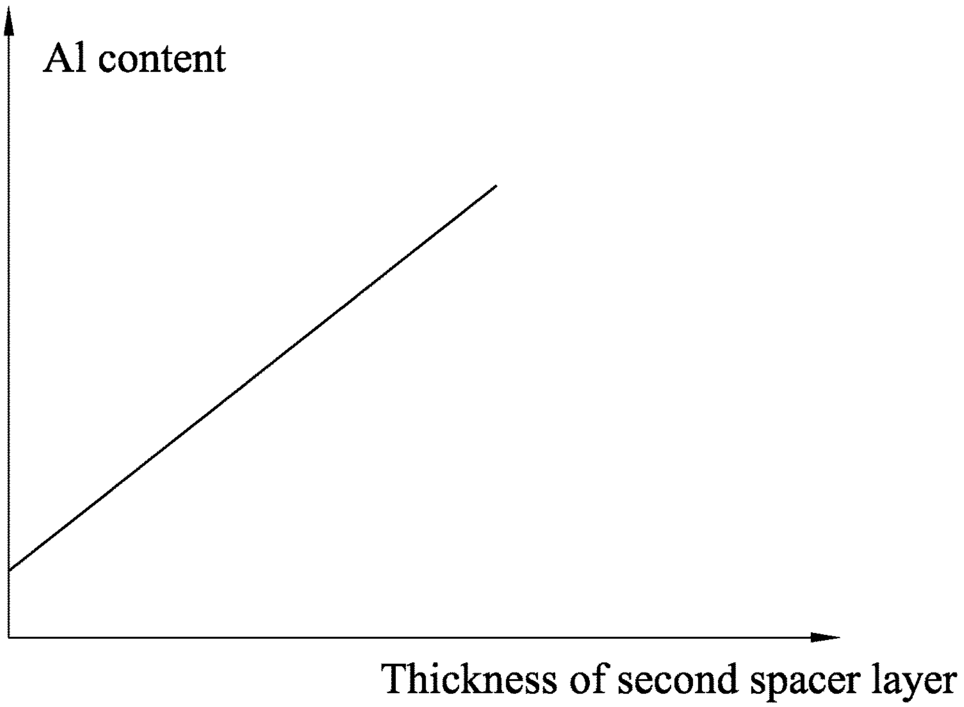
FIG. 5 illustrates an increase manner of an Al content within a spacer layer of the second semiconductor layer of the epitaxial structure shown in FIG. 4.
Figure 6:
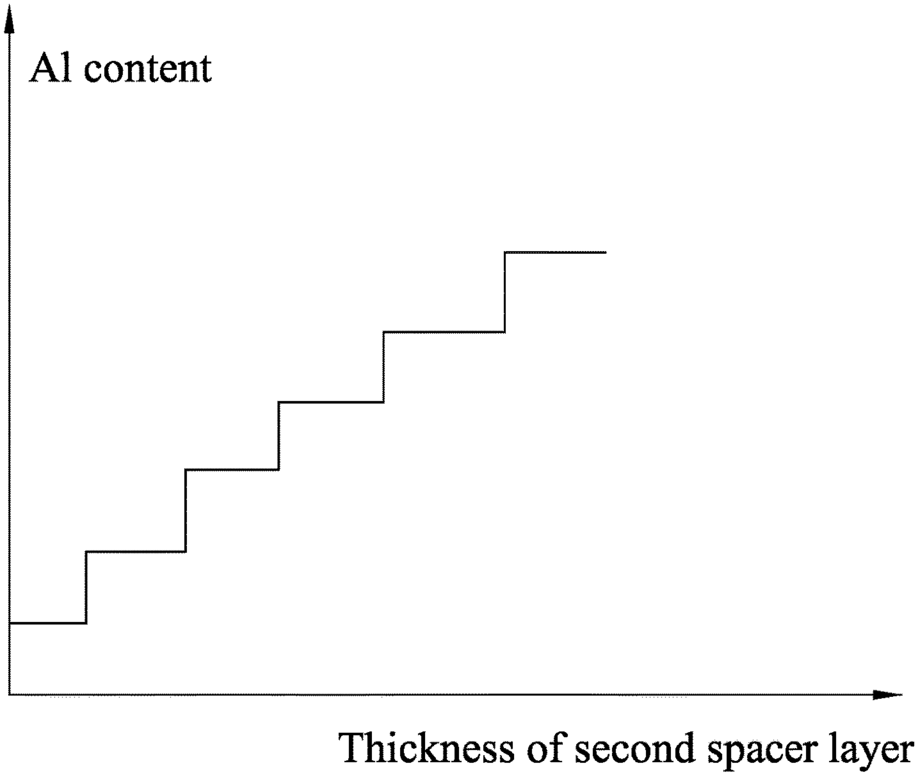
FIG. 6 illustrates another increase manner of an Al content within the spacer layer of the second semiconductor layer of the epitaxial structure shown in FIG. 4.

FIG. 4 shows a variation of the first embodiment of the epitaxial structure shown in FIG. 1, in which the second spacer layer 310 includes at least M1 number of sub-layers, where M1≥2. In this embodiment, the second spacer layer 310 has an Al content which increases gradually along the first direction. Moreover, the Al content of the second spacer layer 310 increases either gradually or stepwise along the first direction. FIG. 5 illustrates a linear increase of the Al content within the second spacer layer 310 along the first direction. FIG. 6 illustrates a stepwise increase of the Al content within the second spacer layer 310 along the first direction. Having an Al content increase in either of the above two manners, the second spacer layer 310 may further block charge carriers from overflowing. Specifically, some charge carriers may spread laterally and distribute uniformly before flowing into the active layer 200, and therefore the spreading of charge carriers is further improved. Furthermore, each of the two manners of increasing the Al content in the second spacer layer 310 may be combined with either of the two increase manners of the Al content in the second capping layer 320. In other words, when the Al content in the second capping layer 320 increases gradually, the Al content in the second spacer layer 310 may increase either gradually or stepwise; and when the Al content in the second capping layer 320 increases stepwise, the Al content in the second spacer layer 310 may increase either gradually or stepwise.

Figure 7:
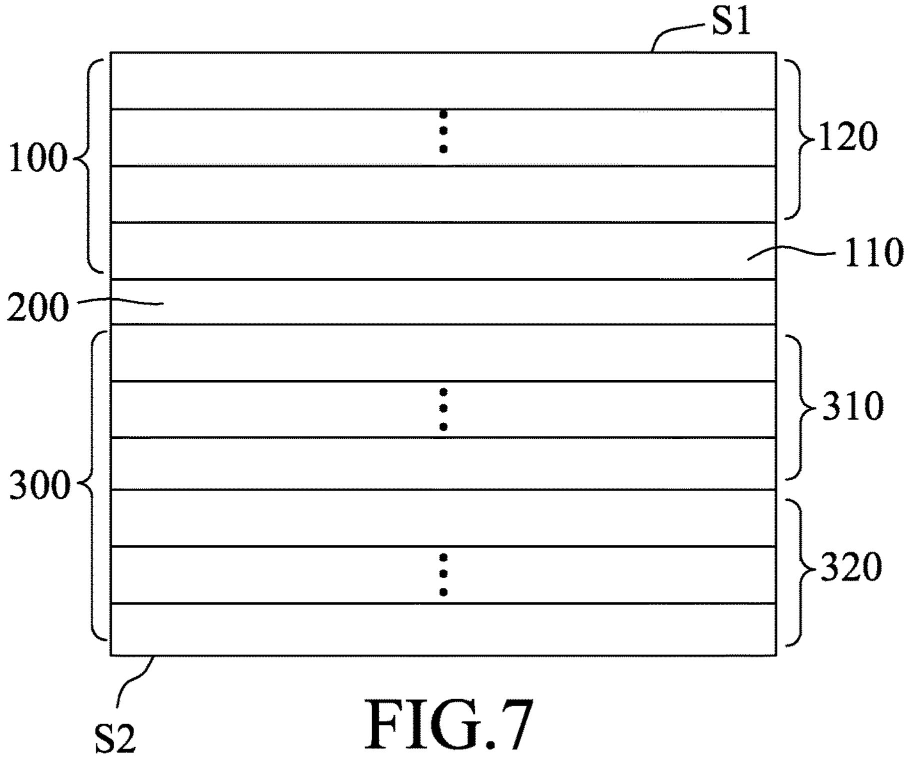
FIG. 7 shows a structural schematic view of a second embodiment of an epitaxial structure according to the present disclosure.

FIG. 7 shows a second embodiment of the epitaxial structure according to the present disclosure. The epitaxial structure of this embodiment has a structure similar to the first embodiment except for the first spacer layer 110 and the first capping layer 120. In the embodiment shown in FIG. 7, in addition to the second capping layer 320 including N1 number of sub-layers and the second spacer layer 310 including M1 number of sub-layers as shown in FIG. 4, the first capping layer 120 includes at least N2 number of sub-layers, where N2≥2. Each of the sub-layers of the first capping layer 120 contains a material represented by $Al_{y2}Ga_{1-y2}InP$, where $0.2<y2\leq1$. A last sub-layer of the sub-layers of the first capping layer 120 in the second direction (i.e., the sub-layer that is closest to the first surface S1) contains AlInP. The first capping layer 120 and the second capping layer 320 with the aforesaid arrangement can more effectively block charge carriers from overflowing, thereby further improving brightness and luminous efficiency.

In certain embodiments, the first capping layer 120 has an Al content which increases and then remains constant along the second direction. Specifically, the Al content of the first capping layer 120 may increase either gradually or stepwise along the second direction.

Figure 8:
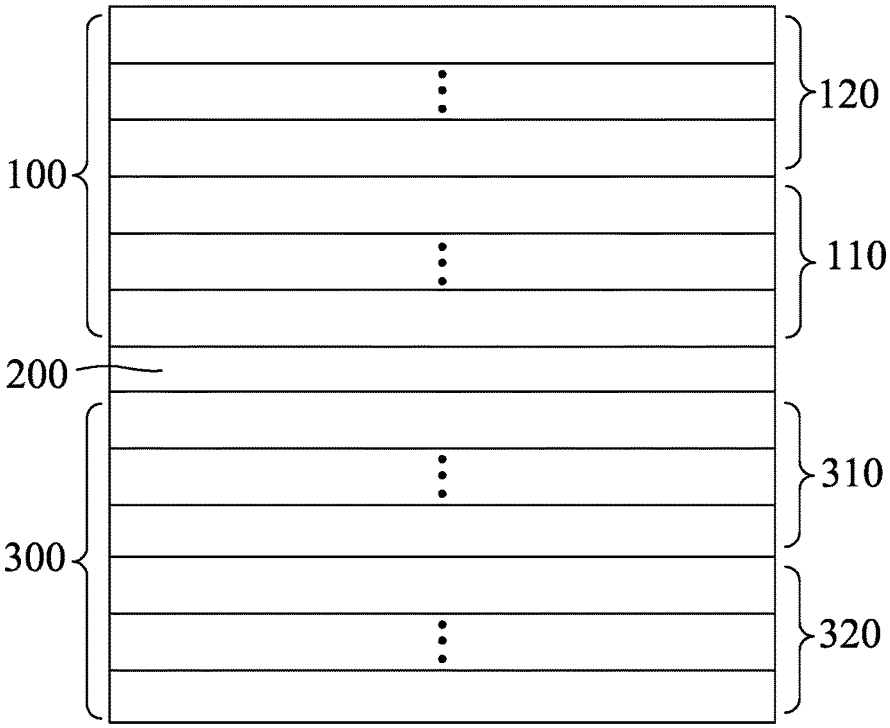
FIG. 8 shows a structural schematic view of a variation of the second embodiment of the epitaxial structure shown in FIG. 7.

In addition, the first spacer layer 110 may contain a material represented by $Al_{x2}Ga_{1-x2}InP$, where $0.2\leq x2<1$. Referring to FIG. 8, the first spacer layer 110 may include at least M2 number of sub-layers, where M2≥2. The Al content of the first spacer layer 110 increases either gradually or stepwise along the second direction.

Figure 9:
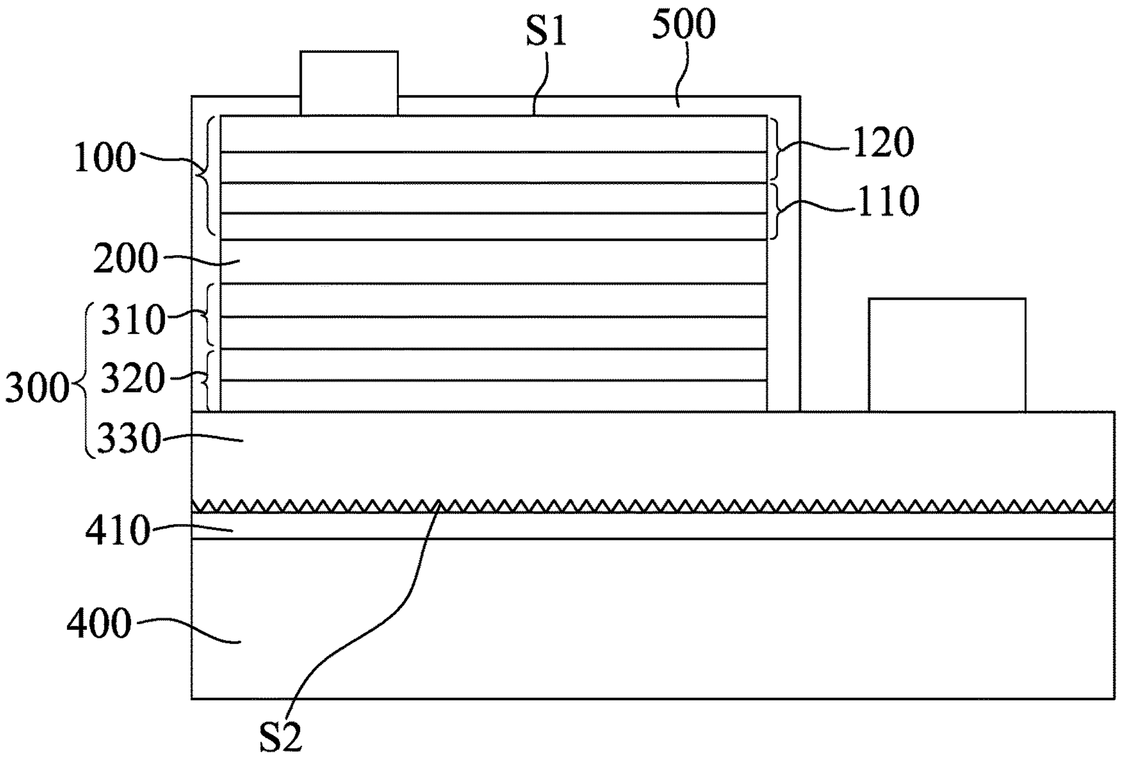
FIG. 9 shows a structural schematic view of an embodiment of a flip-chip light-emitting device according to the present disclosure.

FIG. 9 illustrates an embodiment of a flip-chip light-emitting device according to the present disclosure. The flip-chip light-emitting device includes at least one of the aforesaid epitaxial structures according to the disclosure formed on a substrate 400. The flip-chip light-emitting device is formed by first providing the epitaxial structure on a growth substrate (not shown). As aforesaid, the epitaxial structure includes the first-type semiconductor layer 100, the active layer 200, and the second-type semiconductor layer 300 arranged in the first direction. The second-type semiconductor layer 300 includes the second spacer layer 310 and the second capping layer 320 arranged in the first direction. The second capping layer 320 includes at least N1 number of sub-layers, where N1≥2. Each of the sub-layers of the second capping layer 320 contains a material represented by $Al_{y1}Ga_{1-y1}InP$, where $0.2<y1\leq1$. The last sub-layer of the sub-layers of the second capping layer 320 in the first direction contains AlInP. The second capping layer 320 has the Al content which increases gradually along the first direction.

Subsequently, the epitaxial structure is transferred from the growth substrate to the substrate 400 by bonding the second surface (S2) of the epitaxial structure to the substrate 400 and removing the growth substrate. The substrate 400 may be an conductive substrate or a non-conductive substrate and may be transparent or non-transparent. In one embodiment, the epitaxial structure is bonded to the substrate 400 through a bonding layer 410.

In the embodiment shown in FIG. 9, the first capping layer 120 includes at least N2 number of sub-layers, where N2=2; and the first spacer layer 110 includes at least M2 number of sub-layers, where M2=2. Each of the sub-layers of the first capping layer 120 contains the material represented by $Al_{y2}Ga_{1-y2}InP$, where $0.2<y2\leq1$. The last sub-layer of the sub-layers of the first capping layer 120 in the second direction contains AlInP. The first capping layer 120 and the second capping layer 320 adopting the aforementioned design may block charge carriers from overflowing, thereby further improving brightness and luminous efficiency. In addition, each of the first capping layer 120, the first spacer layer 110, the second capping layer 320, and the second spacer layer 310 may independently have a design chosen from any one of the aforesaid embodiments of the epitaxial structures.

Referring to FIG. 9, the flip-chip light-emitting device may further include an insulating protective layer 500 that is disposed on the first surface (S1) and a part of a sidewall of the epitaxial structure. In this embodiment, the insulating protective layer 500 may include a non-conductive material, selected from inorganic oxides or nitrides, for example, silicon dioxide, silicon nitride, titanium oxide, tantalum oxide, niobium oxide, barium titanate, magnesium fluoride, aluminum oxide, or combinations thereof. The insulating protective layer 500 may include, for example, a distributed Bragg reflector (DBR) that is formed from at least two of the aforesaid materials that are alternately disposed.

Furthermore, in FIG. 9, the second-type semiconductor layer further includes a window layer 330 that is opposite to the active layer 200. The window layer 330 has a surface connected to the bonding layer 410, which is roughened so that the bonding strength between the bonding layer 410 and the second-type semiconductor layer may be improved.

In addition to the aforementioned features, the embodiment of the light-emitting device of the present disclosure may include other structural features, such as electrode(s), an ohmic contact layer, a current spreading layer, etc.

Figure 10:
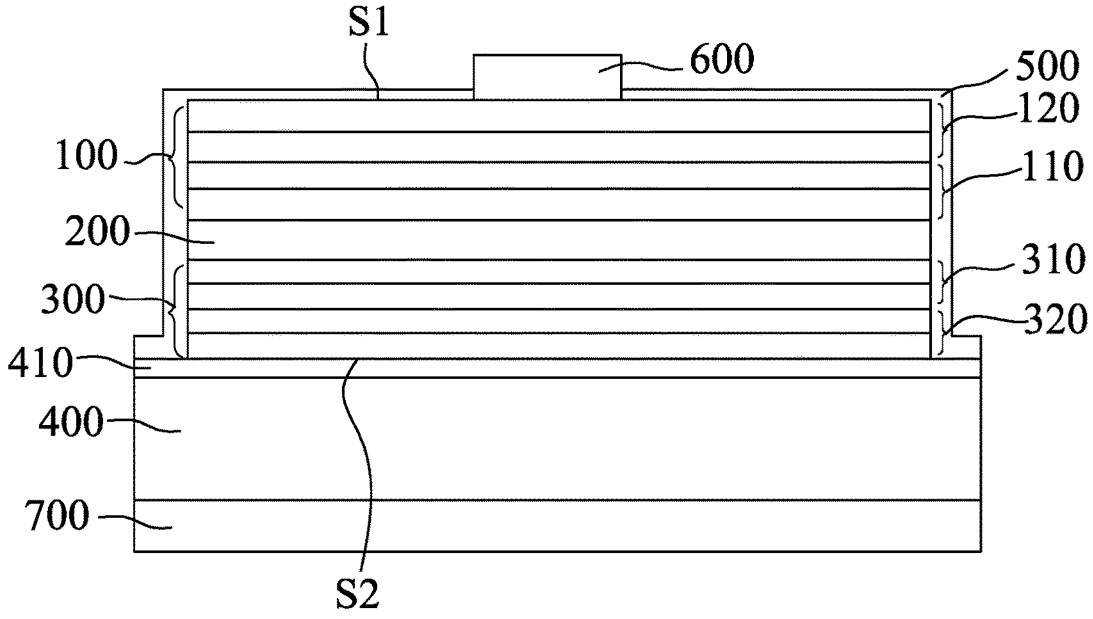
FIG. 10 shows a structural schematic view of an embodiment of a vertical type light-emitting device according to the present disclosure.

FIG. 10 illustrates an embodiment of a vertical type light-emitting device according to the disclosure, which includes one of the aforesaid embodiments of the epitaxial structure according to the disclosure. The vertical type light-emitting device includes two electrodes 600, 700 that are positioned on two opposite sides of the epitaxial structure. Such configuration allows current to flow almost vertically through the epitaxial structure, which may have an improved current spreading as compared to a planar configuration of a flip-chip light-emitting device, thereby increasing luminous efficiency. Additionally, this configuration may have a reduced loss of light and hence allow a larger light-emission area of the light-emitting device.

Referring to FIG. 10, as mentioned above, the epitaxial structure has the first surface (S1) and the second surface (S2) that is opposite to the first surface (S1). The epitaxial structure includes, along the first direction from the first surface (S1) to the surface (S2), the first-type semiconductor layer 100, the active layer 200, and the second-type semiconductor layer 300. The second-type semiconductor layer 300 includes the second spacer layer 310 and the second capping layer 320 arranged in the first direction. The second capping layer 320 includes at least N1 number of sub-layers, where N1=2; the second spacer layer 310 includes at least M1 number of sub-layers, where M1=2. The second capping layer 320 contains the material represented by $Al_{y1}Ga_{1-y1}InP$, where $0.2<y1\leq1$. The last sub-layer of the sub-layers of the second capping layer 320 in the first direction contains AlInP. The second capping layer 320 has an Al content which increases gradually along the first direction. In this embodiment, the vertical type light-emitting device includes the substrate 400 which is a conductive substrate. During manufacturing, the epitaxial structure is first formed on a growth substrate, and then, the epitaxial structure is transferred from the growth substrate to the substrate 400 and the second surface (S2) of the epitaxial structure is bonded to the substrate 400 through the bonding layer 410 which is a conductive bonding layer.

In one embodiment, as shown in FIG. 10, the first capping layer 120 of the vertical type light-emitting device may include at least N2 number of sub-layers, where N2≥2. The first capping layer 120 may contain a material represented by $Al_{y2}Ga_{1-y2}InP$, where 0.2<y2≤1. The last sub-layer of the sub-layers of the first capping layer 320 in the second direction contains AlInP. The first capping layer 120 and the second capping layer 320 with the aforementioned configuration may block charge carriers from overflowing, thereby further improving brightness and luminous efficiency.

In certain embodiments, the conductive substrate may include a conductive material, such as GaP, SiC, Si, and GaAs. The bonding layer 410 may include a metallic conductive material.

Referring to FIG. 10, the vertical type light-emitting device may further include the insulating protective layer 500 that is disposed on the first surface (S1) and the sidewall of the epitaxial structure. In this embodiment, the insulating protective layer 500 may include a non-conductive material, selected from inorganic oxides or nitrides, for example, silicon dioxide, silicon nitride, titanium oxide, tantalum oxide, niobium oxide, barium titanate, magnesium fluoride, aluminum oxide, or combinations thereof.

In addition to the aforementioned features, the light-emitting device of the present embodiment may include other structural features, such as an ohmic contact layer, a current spreading layer, etc.

The disclosure further provides a light-emitting apparatus that includes at least one of the aforesaid embodiments of the light-emitting device. The light-emitting apparatus may be a display, a lighting apparatus or other optical equipment, which may include the light-emitting device emitting red light or infrared light.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:

an epitaxial structure having a first surface and a second surface that is opposite to the first surface, and, along a first direction from said first surface to said second surface, including:

a first-type semiconductor layer, an active layer, and a second-type semiconductor layer including a capping layer that includes at least N1 number of sub-layers arranged in said first direction, where N1≥2, and that has an Al content which increases and then remains constant along said first direction, each of said sub-layers containing a material represented by $Al_{y1}Ga_{1-y1}InP$, where 0<y1≤1, wherein said first-type semiconductor layer includes a spacer layer and a capping layer disposed along a second direction from said second surface to said first surface, and wherein said spacer layer of said first-type semiconductor layer contains a material represented by $Al_{x2}Ga_{1-x2}InP$, where 0.2≤x2<1.

2. The light-emitting device according to claim 1, wherein the Al content increases either gradually or stepwise along said first direction.

3. The light-emitting device according to claim 1, wherein in $Al_{y1}Ga_{1-y1}InP$, 0.2<y1≤1.

4. The light-emitting device according to claim 1, wherein a last sub-layer of said sub-layers of said capping layer of said second-type semiconductor layer in said first direction contains AlInP.

5. The light-emitting device according to claim 1, wherein said second-type semiconductor layer further includes a spacer layer located between said active layer and said capping layer, said spacer layer of said second-type semiconductor layer containing a material represented by $Al_{x1}Ga_{1-x1}InP$, where 0.2≤x1<1.

6. The light-emitting device according to claim 5, wherein in said second-type semiconductor layer, 0.2≤x1<y1≤1.

7. The light-emitting device according to claim 5, wherein said spacer layer of said second-type semiconductor layer includes at least M1 number of sub-layers, where M1≥2.

8. The light-emitting device according to claim 5, wherein said spacer layer of said second-type semiconductor layer has an Al content which increases gradually along said first direction.

9. The light-emitting device according to claim 8, wherein the Al content of said spacer layer of said second-type semiconductor layer increases either gradually or stepwise along said first direction.

10. The light-emitting device according to claim 5, wherein said spacer layer of said second-type semiconductor layer has a doping concentration that is lower than $1E17/cm^3$, and has a thickness less than 300 nm.

11. The light-emitting device according to claim 1, wherein said capping layer of said second-type semiconductor layer is doped with a p-type dopant with a doping concentration ranging from $2E17/cm^3$ to $5E18/cm^3$.

12. The light-emitting device according to claim 1, wherein said capping layer of said second-type semiconductor layer is doped with an n-type dopant with a doping concentration ranging from $2E17/cm^3$ to $5E18/cm^3$.

13. The light-emitting device according to claim 1, wherein said capping layer of said first-type semiconductor layer includes at least N2 number of sub-layers, where N2≥2, and has an Al content which increases and then remains constant along said second direction, each of said sub-layers of said capping layer of said first-type semiconductor layer containing a material represented by $Al_{y2}Ga_{1-y2}InP$.

14. The light-emitting device according to claim 13, wherein a last sub-layer of said sub-layers of said capping layer of said first-type semiconductor layer in said second direction contains AlInP, and in said capping layer, $0.2<y2\leq 1$.

15. The light-emitting device according to claim 13, wherein the Al content of said capping layer of said first-type semiconductor layer increases either gradually or stepwise along said second direction.

16. The light-emitting device according to claim 1, wherein said spacer layer of said first-type semiconductor layer includes at least M2 number of sub-layers, where M2≥2.

17. The light-emitting device according to claim 1, wherein said spacer layer of said first-type semiconductor layer has an Al content which increases either gradually or stepwise along said second direction.

18. A light-emitting apparatus comprising the light-emitting device according to claim 1.

* * * * *